United States Patent
Uzoh

(10) Patent No.: US 6,582,579 B1
(45) Date of Patent: Jun. 24, 2003

(54) METHODS FOR REPAIRING DEFECTS ON A SEMICONDUCTOR SUBSTRATE

(75) Inventor: Cyprian Uzoh, Milpitas, CA (US)

(73) Assignee: NuTool, Inc., Milpitas, CA (US)

( * ) Notice: Subject to any disclaimer, the term of this patent is extended or adjusted under 35 U.S.C. 154(b) by 0 days.

(21) Appl. No.: 09/534,704

(22) Filed: Mar. 24, 2000

(51) Int. Cl.$^7$ .............................................. C25D 5/02
(52) U.S. Cl. ..................... 205/115; 205/123; 205/206; 205/87; 156/345.12; 438/633; 438/690; 438/759
(58) Field of Search ................. 205/115, 123, 205/206, 87; 156/345.12; 438/633, 690, 759

(56) References Cited

U.S. PATENT DOCUMENTS

| | | | |
|---|---|---|---|
| 3,959,089 A | 5/1976 | Watts | 204/26 |
| 4,610,772 A | 9/1986 | Palnik | 204/206 |
| 5,024,735 A | 6/1991 | Kadija | 204/15 |
| 5,142,828 A | 9/1992 | Curry, II | 51/281 |
| 5,171,412 A | 12/1992 | Talieh et al. | 204/192 |
| 5,429,733 A | 7/1995 | Ishida | 204/234 |
| 5,558,568 A | 9/1996 | Talieh et al. | 451/303 |
| 5,692,947 A | 12/1997 | Talieh et al. | 451/41 |
| 5,755,859 A | 5/1998 | Brusic et al. | 106/1.22 |
| 5,807,165 A | 9/1998 | Uzoh et al. | 451/41 |
| 5,833,820 A | 11/1998 | Dubin | 204/212 |
| 5,863,412 A | 1/1999 | Ichinose et al. | 205/652 |
| 5,882,498 A | 3/1999 | Dubin et al. | |
| 5,911,619 A | 6/1999 | Uzoh | 451/5 |
| 5,928,492 A | 7/1999 | Corlett et al. | |

(List continued on next page.)

FOREIGN PATENT DOCUMENTS

| | | |
|---|---|---|
| EP | 0 878 834 A2 | 11/1998 |
| EP | 0 928 024 A2 | 1/1999 |

OTHER PUBLICATIONS

Moosburger, G.: "Selbstheilende ICS"; *Elektronik*, Franzis Verlag GMBH, Munchen, DE, vol. 39, No. 19, Sep. 14, 1990, p. 23.

"Spot Plating Tool for Thin Film Circuit Repair"; *IBM Technical Disclosure Bulletin*, IBM Corp., New York, U.S., vol. 32, No. 12, May 1, 1990, pp. 439–440.

Steigerwald J.M. et al; Electrochemical Potential Measurements During the Chemical–Mechanical Polishing of Copper Thin Films Journal of the *Electrochemical Society*, Electrochemical Society, Manchester, NH, U.S., vol. 142, No. 7, Jul. 1995, pp. 2379–2385.

J.M. Steigerwald, et al., "Pattern Geometry Effects in the Chemical–Mechanical Polishing of Inlaid Copper Structures", Oct. 1994, pp. 2842–2848.

Alan C. West, et al., "Pulse Reverse Copper Electrodeposition in High Aspect Ration Trenches and Vias", Sep. 1998, pp. 3070–3073.

Robert C. Contolini, et al., "Electrochemical Planarization for Multilevel Metallization", Sep. 1994, pp. 2503–2510.

M. Rubenstein, "Tamponglavanisieren in der Praxis Teil 1" Galvanotechnik, vol. 79, No. 10, 1988 pp. 3263–3270 (no month).

C. Madore, et al., "Blocking Inhibitors in Catholic Leveling", I. "Theoretical Analysis", Dec. 1996, pp. 3927–3942.

*Primary Examiner*—Nam Nguyen
*Assistant Examiner*—Wesley A. Nicolas
(74) *Attorney, Agent, or Firm*—NuTool Legal Department

(57) ABSTRACT

The present invention relates to methods for repairing defects on a semiconductor substrate. This is accomplished by selectively depositing the conductive material in defective portions in the cavities while removing residual portions from the field regions of the substrate. Another method according to the present invention includes forming a uniform conductive material overburden on a top surface of the substrate. The present invention also discloses a method for depositing a second conductive material on the first conductive material of the substrate.

25 Claims, 4 Drawing Sheets

U.S. PATENT DOCUMENTS

| | | | |
|---|---|---|---|
| 5,930,669 A | 7/1999 | Uzoh | 438/627 |
| 5,933,753 A | 8/1999 | Simon et al. | 438/629 |
| 6,004,880 A | 12/1999 | Liu et al. | 438/692 |
| 6,168,704 B1 * | 1/2001 | Brown et al. | 205/118 |
| 6,171,467 B1 * | 1/2001 | Weihs et al. | 205/93 |
| 6,176,992 B1 * | 1/2001 | Talieh | 205/87 |
| 6,218,290 B1 * | 4/2001 | Schonauer et al. | 438/633 |
| 6,290,833 B1 * | 9/2001 | Chen | 205/182 |

\* cited by examiner

METHODS FOR REPAIRING DEFECTS ON A SEMICONDUCTOR SUBSTRATE

FIELD OF THE INVENTION

The present invention relates to methods for repairing defects on a semiconductor substrate. More particularly, the present invention is directed to methods for repairing defects on a top surface of the substrate by selectively plating over the defective portions while preventing deposition in the non-defective portions. In addition, the present invention relates to planarizing a non-planar conductive surface of a substrate.

BACKGROUND OF THE INVENTION

Depositing a conductive material such as metal in damascene type cavities (i.e., trenches, holes, and vias) of a semiconductor substrate (i.e., wiring structure) is an important and necessary process in fabricating integrated chips and devices. The conductive material is deposited in the cavities of the substrate to interconnect layers and components contained therein. Recently, there is great interest in using copper as the conductive material as it provides better conductivity and reliability than, for example, aluminum or aluminum alloys.

FIG. 1A illustrates a cross sectional view and FIG. 1B illustrates a perspective view of a substrate after depositing the conductive material in the cavities. These figures illustrate a dielectric or insulating layer 2 (e.g., silicon dioxide—$SiO_2$) having deposited thereon an adhesive or barrier layer 4. The insulating layer 2 is generally etched to form the cavities 12 therein before the barrier layer 4 is deposited thereon. The cavities 12 in the insulating layer 2 are generally etched using a reactive ion etching (RIE) method. The barrier layer 4 is generally deposited on the insulating layer 2 using any of the various sputtering methods, chemical vapor deposition (CVD), electro-deposition or electroless plating method. The barrier layer 4 may be tantalum (Ta), titanium (Ti), tungsten (W), titanium-tungsten (TiW), titanium nitride (TiN), Nb, CuWP, CoWP, or other materials or combinations thereof that are commonly used in this field.

After the barrier layer 4 is deposited on the insulating layer 2, a seed layer (not shown) is generally deposited thereon before the conductive material 6 such as copper is deposited on the substrate. In general, the seed layer is the same material as the conductive material 6. The conductive material 6 can be deposited using CVD, sputtering, electroless plating, electro-deposition, or combinations thereof.

The depths of the cavities 12 in the insulating layer 2 can range from 0.02 to 200 um for interconnects and up to 1000 um or more for packages. The conductive material 6 is generally deposited over the entire top surface of the substrate, i.e. in the cavities 12 as well as on the field regions 3. It should be noted that the field regions 3 are defined as the top surface area of the substrate between the cavities 12. The excess material deposited over the top plane of the field regions 3 is known as the overburden. The thickness of the overburden may change over the various features of the substrate depending on their size. For example, in general, the overburden is thicker over the smaller cavities than the larger cavities.

Once the conductive material 6 is formed in the cavities 12 and on the field regions 3, the substrate is typically transferred to an apparatus for polishing and removing the overburden from the top surface (i.e., field regions). Typically, the substrate is polished using a conventional chemical mechanical polishing (CMP) device and abrasive slurry. While using this method, some conductive material 6 grains may be removed from the cavities 12, thereby resulting in substrates with various defects. For example, certain grains of the conductive material 6 in the cavities 12 may be corroded away because the abrasive slurry may attach itself to the conductive material 6 grains. Thus, some grains of the conductive material 6 may be etched away from the cavities 12, leaving defective portions 8. Alternatively, defective portions 8 may result from deep scratches during the CMP process.

Defective portions 8 may also result from the conductive material 6 deposition process itself. For example, non-optimal deposition processes may give rise to voids in conductive material 6, and after polishing, such voids may result in the defective portions 8. Further, residual conductive material 10 may not be completely removed and left on the barrier layer 4, thereby resulting in additional defects. As known, defects typically reduce the quality of the conductive material 6 and device performance.

FIG. 2 illustrates a cross sectional view of a substrate having dishing effects. During the CMP process, "dishing" or non-planar polishing may result because of over polishing. A large recess 14 may be formed in a large test pad portion, while a small recess 16 may be formed in a small bus line portion on the cavities 12 of the substrate. In addition, when the substrate is exposed to the abrasives during the CMP process, corrosion and other undesirable characteristics may result (i.e., dishing). Dishing may also result from wet etching processes. It is well known that existence of any kind of defects in the deposited conductive material results in poor device performance and low process yield.

Accordingly, there is a need for methods for repairing defects on semiconductor substrates.

SUMMARY OF THE INVENTION

In view of the above-described problems of the prior art, it is an object of the present invention to provide a method for repairing defects on a semiconductor substrate.

It is another object of the present invention to provide a method for repairing defects on a semiconductor substrate by selectively plating over the defective portions while preventing or minimizing deposition on the non-defective portions.

It is another object of the present invention to provide a method for depositing a conductive material in defective portions of the cavities on the substrate.

It is a further object of the present invention to provide a method for providing a uniform conductive material overburden on the substrate without depositing the conductive material on the field regions of the substrate.

It is yet another object of the present invention to provide a method for depositing a second conductive material on the first conductive material of a substrate.

It is yet another object of the present invention to provide a method that minimizes the disparity of the conductive material overburden across a substrate while repairing defects on the substrate.

These and other objects are achieved by providing methods for repairing defects on the substrate in an efficient and reliable manner. The present invention relates to methods for repairing defects on a semiconductor substrate. This is accomplished by selectively depositing the conductive material in defective portions in the cavities while removing residual portions from the field regions of the substrate. Another method according to the present invention includes forming a uniform conductive material overburden on the top surface of the substrate. The present invention also discloses a method for depositing a second conductive material on the first conductive material of the substrate.

BRIEF DESCRIPTION OF THE DRAWINGS

These and other objects and advantages of the present invention will become apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

Figure 1A:
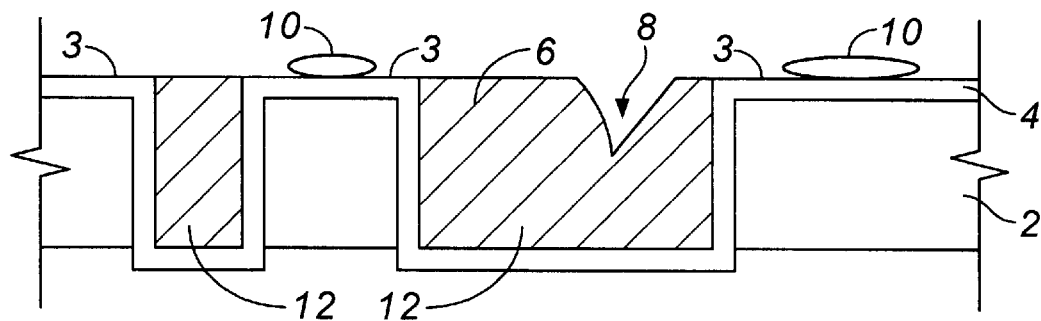
FIG. 1A illustrates a cross sectional view of a conductive material disposed on a substrate having defects.

The present invention will now be described in greater detail, which may serve to further the understanding of the preferred embodiments of the present invention. As described elsewhere herein, various refinements and substitutions of the various embodiments are possible based on the principles and teachings herein.

The preferred embodiments of the present invention will be described with reference to FIGS. 3–5, wherein like structures and materials are designated by like reference numerals throughout the various figures. Further, specific details and processing parameters are provided herein and are intended to be explanatory rather than limiting.

The inventors of the present invention disclose herein methods for repairing defects on a substrate. The present invention can be used with any substrate or workpiece such as a wafer, flat panel, magnetic film head, integrated circuit, device, chip, and packaging substrate, and it can be used with various conductive materials including, but not limited to copper, copper alloys, magnetic films, ferromagnetic films, lead tin solder alloys or lead free solder alloys.

In accordance with the present invention, the defective substrate is preferably plated using an electro-deposition or electroless deposition process before removing the barrier layer from the top surface of the substrate. The barrier layer is used to conduct the electric current, and depending on the deposition time and current density, various portions of the substrate is plated accordingly.

FIGS. 3A–3D illustrate cross sectional views of a method for repairing defects in accordance with the first preferred embodiment of the present invention. In this preferred embodiment, defects in the cavities of the substrate are repaired by selectively plating over the defective regions, while simultaneously preventing deposition in the field regions of the substrate.

The method shown in FIGS. 3A–3D include the step of depositing a conductive material in the cavities of the substrate to repair the defects using an ECMD (electrochemical mechanical deposition) device having a pad type material attached to an anode. Such apparatus is described in greater detail in the U.S. application Ser. No. 09/373,681, filed Aug. 13, 1999, entitled "Method and Apparatus for Depositing and Controlling the Texture of A Thin Film", and now U.S. Pat. No. 6,409,904, the contents of which are expressly incorporated herein by reference.

Figure 1B:
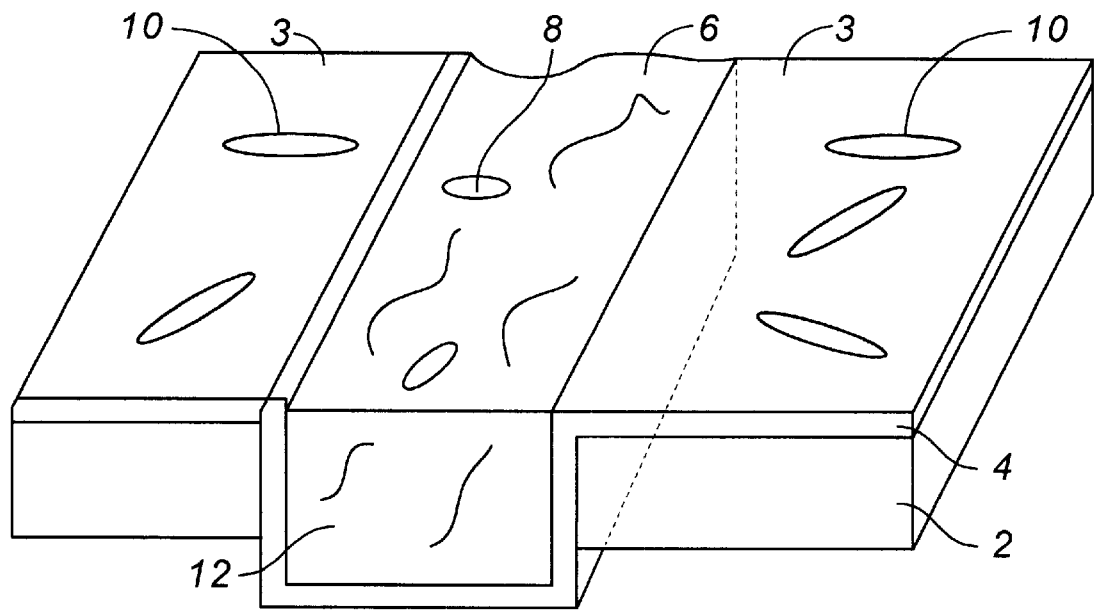
FIG. 1B illustrates a perspective view of FIG. 1A of a conductive material disposed on a substrate having defects.
Figure 2:
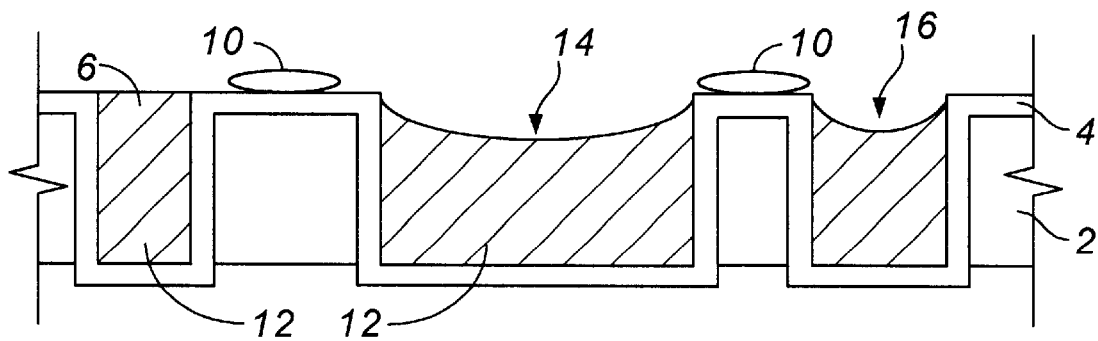
FIG. 2 illustrates a cross sectional view of a conductive material disposed on a substrate having "dishing" characteristics.
Figure 3A:
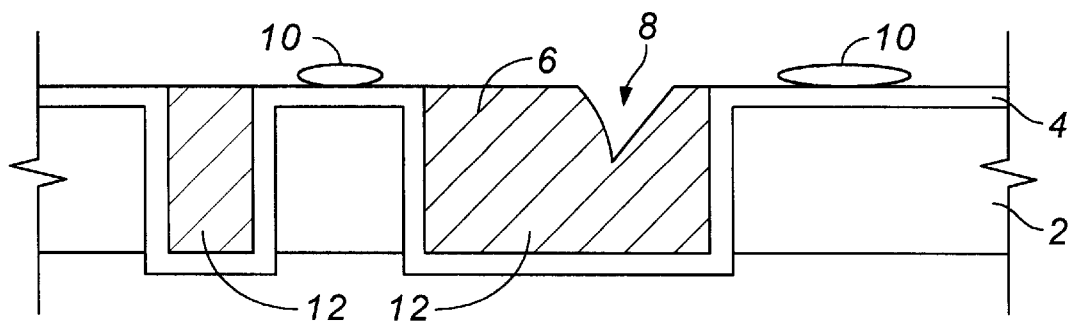
FIGS. 3A–3D illustrate cross sectional views of a method for repairing defects in accordance with the preferred embodiment of the present invention.

FIG. 3A illustrates an insulating layer 2 having deposited thereon a barrier layer 4, similar to that described above with reference to FIGS. 1A and 1B. Again, the top surface of the insulating layer 2 is patterned/etched with cavities 12 before the barrier layer 4 is deposited thereon. The insulating layer 2 is preferably $SiO_2$ or polyimide, but it is understood that other materials that are commonly used as the insulating layer 2 may be used in accordance with the present invention.

Figure 3B:
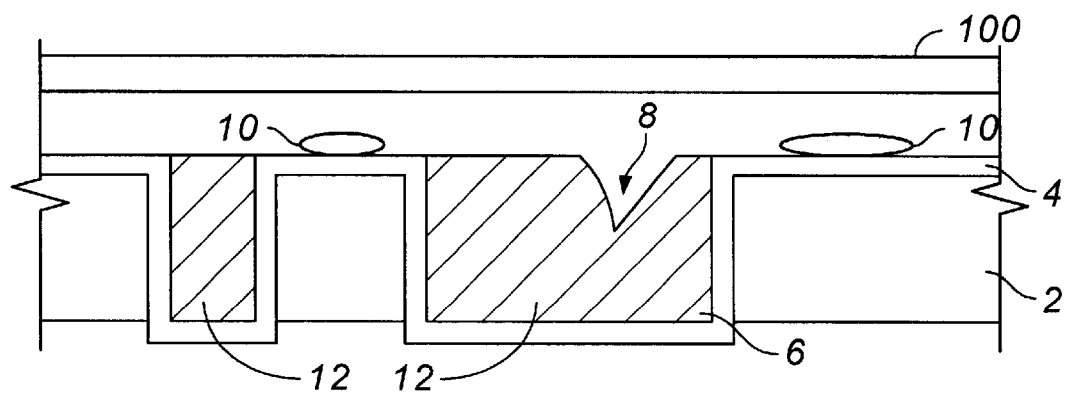

In FIG. 3B, a porous pad type material 100 with or without fixed abrasive particles (not shown) is used to repair the defects 8, 10 on the substrate. This is accomplished by selectively depositing the conductive material in the defective portion 8 while removing the residual material 10 from the field regions of the substrate. The pad type material 100 is preferably attached to an anode (not shown) and may be rotated in a circular motion, vibrated, moved side to side or vertically when brought into contact with the top surface of the substrate. Likewise, the substrate may be rotated in a circular motion, vibrated, moved side to side or vertically when brought into contact with the pad type material 100. In the preferred embodiment, the pad type material 100 and the substrate may rotate between 1 to 400 rpm, but preferably between 5 to 300 rpm, during the repairing mode. A suitable electrolyte containing the conductive material to be deposited is introduced between the pad and the substrate surface before a potential difference is applied between the anode and the barrier layer 4 causing the conductive material to deposit out of the electrolyte onto the substrate surface. An example of the suitable electrolyte is disclosed in the provisional U.S. application Ser. No. 06/182,100, filed Feb. 11, 2000, entitled "Modified Plating Solution for Plating and Planarization", the contents of which are expressly incorporated herein by reference.

Figure 3C:
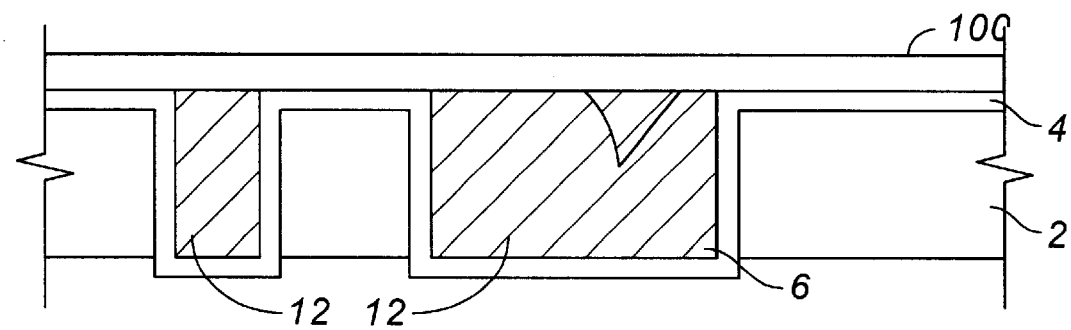
Figure 3D:
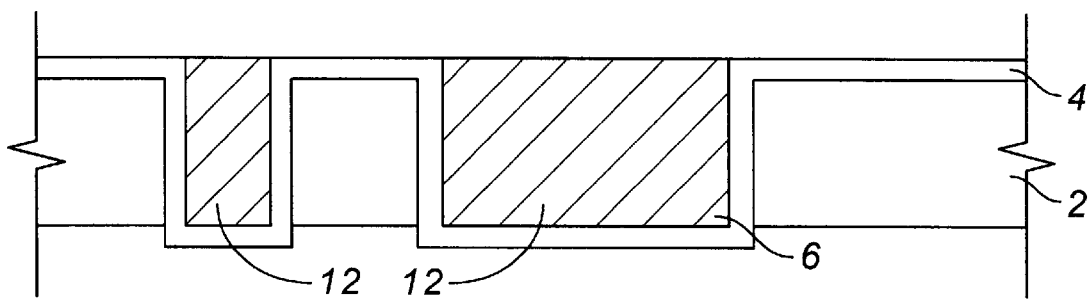

Using the barrier layer 4, an electrical current with a current density in the range of 0.05 to 20 $mA/cm^2$, but preferably between 1 to 5 $mA/cm^2$ is applied to the substrate using the ECMD device. The repairing process can be performed for a period of 30 to 180 seconds when the pad 100 is in full contact with the substrate as shown in FIG. 3C. When such contact is made, the pad type material 100 removes the residual material 10 residing on the field regions of the substrate while depositing the conductive material from the electrolyte into the defective portion 8. During this step, the pad type material 100 makes contact with the top surface of the substrate at a pressure that may range from 0.0 to 15 psi. Further, the electrolyte containing the conductive material may emanate from the pad type material 100 and is applied to the substrate at a rate of 0.2 to 15 liters per minute, but preferably between 0.5 to 10 liters per minute on a conventional 8 inch diameter wafer. Using this method, a planar defect-free structure is obtained as shown in FIG. 3D.

In certain cases it is desirable to have the substrate surface with a uniform and planar layer of a conductive material.

Figure 4A:
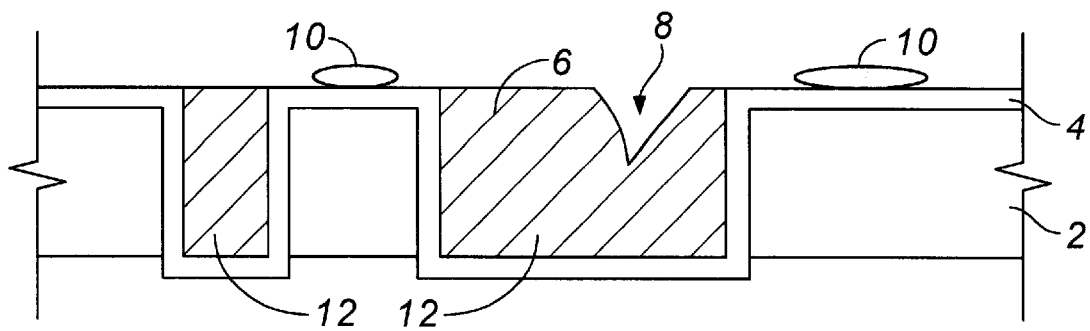
FIGS. 4A–4C illustrate cross sectional views of a method for repairing defects in accordance with another preferred embodiment of the present invention.
Figure 4B:
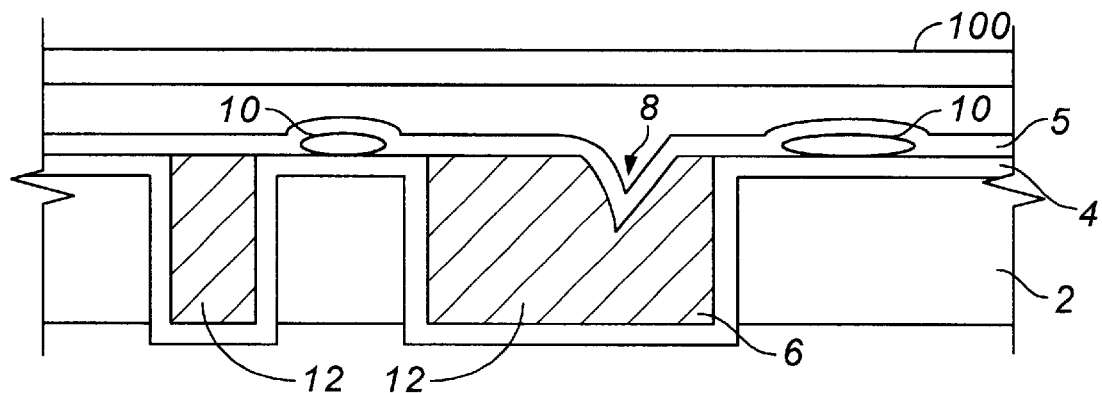
Figure 4C:
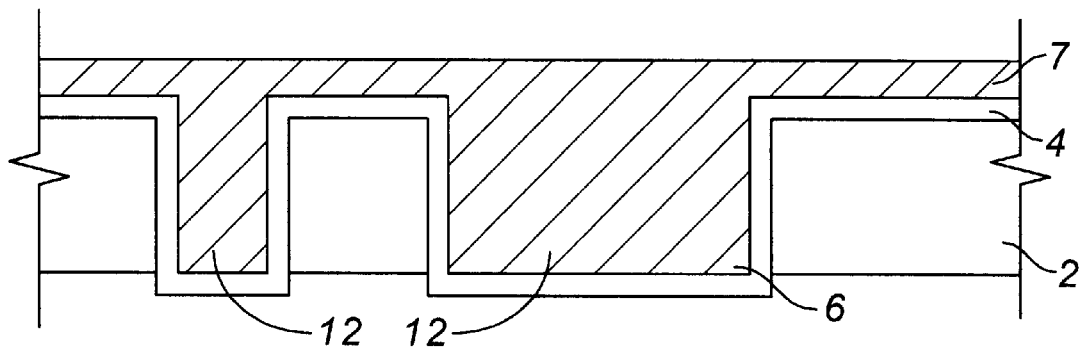

The method disclosed in FIGS. 4A–4C is used to transform a defective substrate surface into a substrate having a planar conductive layer.

In FIG. 4A, a defective substrate similar to the one depicted in FIG. 3A is shown. In FIG. 4B, a seed layer 5 is deposited on the defective substrate surface. The seed layer 5 may be 50–500 A in thickness. It may be a composite layer consisting of two or more layers. It is important to note that the seed layer 5 allows growth of a uniform conductive layer over it with good adhesion to the substrate surface. If the adhesion of the conductive layer to the barrier layer 4 is adequate, there may not be the need for the seed layer 5.

During the repair process, using the barrier layer 4 and seed layer 5, an electrical current with a current density in the range of 0.05 to 20 mA/cm2, but preferably between 1 to 10 mA/cm$^2$ is applied to the substrate using the ECMD device. In this case, the pad 100 does not make contact with the substrate, but does hydroplane over it. The repairing process can be performed for a period of 20 to 300 seconds when the pad 100 is hydroplaning, as shown in FIG. 4B. In this manner, the conductive material is deposited in the defective portion 8 and a uniform metal overburden 7 is built over the entire substrate surface as shown in FIG. 4C, while burying the residual materials 10. During this step, the electrolyte solution containing the conductive material 7 may emanate from the pad type material 100 and may be applied to the substrate at a rate of 0.2 to 6 liters per minute. The pressure may be 0.1 to 2 psi. Low pressure between the substrate and the pad 100 and high electrolyte flow allow the pad 100 to hydroplane over the substrate surface. Both the substrate and the pad 100 may be rotated during deposition at 5 to 300 rpm.

Figure 5A:
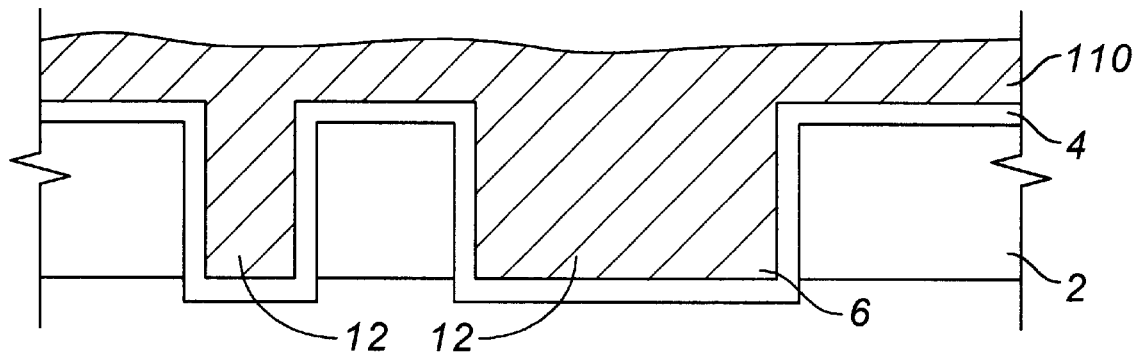
FIGS. 5A–5B illustrate cross sectional views of a method for depositing a second conductive material on a first conductive material in accordance with yet another preferred embodiment of the present invention.
Figure 5B:
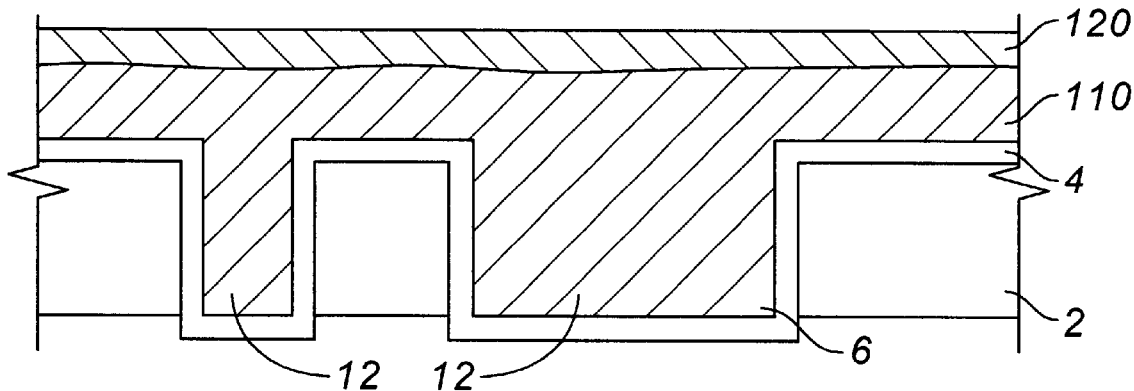

It should be noted that the present technique may be used to planarize a defect free but non-uniform or dished conductive surface on a substrate as shown in FIGS. 5A and 5B. The non-uniform layer 110 on the surface of the substrate of FIG. 5A is coated with a planar layer 120 resulting in the structure of FIG. 5B.

In certain embodiments, the conductive materials 110, 120 may be the same materials. In the alternative, the conductive materials 110, 120 may be different materials. For example, the second conductive material 120 may be Cu—Sn, Cu—In, WCoP or CoP, or other suitable copper alloys, cobalt alloys, silver alloys, etc., and the first conductive material 110 may be Cu. Preferably, the second conductive material 120 should be a material that will enhance corrosion resistance and electromigration, while providing excellent adhesion to the first conductive material 110 and to other subsequently deposited materials that may be formed thereon. Further, the second conductive material 120 may have an electrical resistivity that is very similar to the first conductive material 110, preferably within 90–200% of that of the first conductive material 110.

When the first and second conductive materials 110, 120 are the same materials, a distinct boundary between them may not exist. On the other hand, when the first and second conductive materials 110, 120 are different, a distinct boundary between them may exist before any subsequent thermal process is performed. The distinct boundary layer can be used so that intermixing between the first and second conductive materials 110, 120 is discouraged. For example, a thin adhesive or barrier layer (e.g., alpha Tantalum, chrome layer, CoP, WCoP) may be deposited in between the first and second conductive materials 110, 120 to prevent intermixing between the two materials when such intermixing is undesired. In other embodiments, more than two conductive materials can be formed in the cavities of the substrate using the process disclosed herein.

In a further processing step, the entire substrate as shown in FIG. 5B may be polished by CMP to produce high yield devices. Alternatively, the overburden can be removed by wet etch, electropolishing, or electroplating.

Along with using copper and its alloys as the conductive material, other conductive materials such as aluminum, iron, nickel, chromium, indium, lead, tin, lead-tin alloys, non-leaded solderable alloys, silver, zinc, cadmium, titanium, tungsten molybdenum, ruthenium, gold, paladium, cobalt, rhondium, platinum, their respective alloys and various combinations of above materials with oxygen, nitrogen, hydrogen and phosphorous may be used in the present invention.

In addition, the repairing steps described above may be performed in an electroless deposition bath. Various processing conditions such as plating bath temperature, pressure, pad material, pad design, solution flow rate, and the like can be varied to repair the defects in the substrate material.

In other embodiments, the conductive material or seed layer used for repairing the defect does not need to be homogeneous with the defective conductive material base. For example, in FIG. 4B, the seed layer 5 need not be copper, but may be silver, or a copper or silver based alloy such as copper indium alloy, copper silver alloy or even silver indium alloy. Thus, after depositing the seed layer 5 on the substrate, the defects are repaired using the methods described earlier, using the seed layer and barrier to carry the current. In this case where a substantial uniform overburden 7 of FIG. 4C is left on the field regions, the non-homogeneous seed layer is now part of the overburden 7.

In the previous descriptions, numerous specific details are set forth, such as specific materials, structures, current density, chemicals, processes, etc., to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiment are possible without materially departing from the novel teachings and advantages of this invention.

I claim:

1. A method of repairing defects on a substrate, the substrate having a barrier layer disposed in the cavities and field regions and a first conductive material having defective portions disposed in the cavities, the method comprising:

providing an anode;

applying a pad to the defective portions of the first conductive material, the pad including fixed abrasive particles;

applying an electric current density between the anode and the barrier layer; and depositing a second conductive material from an electrolyte solution to the defective portions of the first conductive material, the electrolyte solution being introduced to the first conductive material between the pad and the substrate.

2. A method according to claim 1 further comprising the step of removing residual conductive materials from the field regions while depositing the second conductive material to the defective portions.

3. A method according to claim 1, wherein the first and second conductive materials comprise a same material.

4. A method according to claim 1, wherein the pad includes a porous material.

5. A method according to claim 1, wherein the applying the pad to the defective portions further comprises one of rotating, vibrating and moving the pad side to side or vertically.

6. A method according to claim 1, wherein the applying the pad to the defective portions further comprises rotating the pad in a circular direction at a rate of 1 to 400 rpm.

7. A method according to claim 1, wherein the applying the pad to the defective portions further comprises rotating the pad in a circular direction at a rate of 5 to 300 rpm.

8. A method according to claim 1, wherein the applying the pad to the defective portions comprises using the pad to make contact with the substrate at a pressure ranging from 0.0 to 15 pounds per square inch.

9. A method according to claim 1, wherein the applying the pad to the defective portions further comprises one of rotating, vibrating and moving the substrate side to side or vertically.

10. A method of repairing defects on a substrate, the substrate having a barrier layer disposed in the cavities and field regions and a first conductive material having defective portions disposed in the cavities, the method comprising:
providing an anode;
applying a pad to the defective portions of the first conductive material, the pad making contact with the substrate;
applying an electric current density between the anode and the barrier layer; and
depositing a second conductive material from an electrolyte solution to the defective portions of the first conductive material, the electrolyte solution being introduced to the first conductive material between the pad and the substrate.

11. A method according to claim 10 further comprising the step of removing residual conductive materials from the field regions while depositing the second conductive material to the defective portions.

12. A method according to claim 10, wherein the first and second conductive materials comprise a same material.

13. A method according to claim 10, wherein the pad includes a porous material.

14. A method of repairing and forming a planar conductive layer on a substrate, the substrate having a barrier layer disposed in the cavities and field regions and a first conductive material having a defective portions disposed in the cavities, the method comprising:
providing an anode;
depositing a seed layer on the cavities and field regions of the substrate, the substrate comprising a dielectric layer;
hydroplaning a pad above the substrate, the pad including fixed abrasive particles;
applying an electric current density between the anode and the barrier and the seed layers; and
depositing a second conductive material from an electrolyte solution to the defective portions of the first conductive material, the electrolyte solution being introduced to the first conductive material between the pad and the substrate, thereby forming the planar conductive layer on the substrate.

15. A method according to claim 14 further comprising the step of burying the residual conductive materials from the field regions while depositing the second conductive material to the defective portions.

16. A method according to claim 14, wherein the first and second conductive materials comprise a same material.

17. A method according to claim 14, wherein the electric current density comprises 0.05 to 20 mA/cm$^2$.

18. A method according to claim 14, wherein the electric current density comprises 1 to 10 mA/cm$^2$.

19. A method according to claim 14, wherein the pad includes a porous material.

20. A method according to claim 14, wherein the hydroplaning the pad comprises rotating the pad in a circular direction at, a rate of 5 to 300 rpm.

21. A method according to claim 14, wherein the thickness of the seed layer is between 50–500 A.

22. A method according to claim 14, wherein the first and second conductive materials comprises copper.

23. A method according to claim 14, wherein the seed layer comprises one of copper, silver, copper alloy, and silver alloy.

24. A method according to claim 14, wherein the first and second conductive materials comprises a group consisting essentially of copper, aluminum, iron, nickel, chromium, indium, lead, tin, lead-tin alloys, lead free solderable alloys, silver, zinc, cadmium, titanium, tungsten molybdenum, ruthenium, gold, paladium, cobalt, rhondium, platinum, and combinations thereof.

25. A method according to claim 14, wherein the dielectric layer comprises a silicon dioxide layer.

* * * * *